US007649492B2

(12) United States Patent  (10) Patent No.: US 7,649,492 B2
Wilens et al.  (45) Date of Patent: Jan. 19, 2010

(54) SYSTEMS AND METHODS FOR PROVIDING DELAYED SIGNALS

(75) Inventors: David Wilens, Oak Hill, VA (US); Mark Hibbard, Arlington, VA (US); William Cummings, Charlottesville, VA (US)

(73) Assignee: Niitek, Inc., Sterling, VA (US)

( * ) Notice: Subject to any disclaimer, the term of this patent is extended or adjusted under 35 U.S.C. 154(b) by 112 days.

(21) Appl. No.: 11/754,127

(22) Filed: May 25, 2007

(65) Prior Publication Data

US 2008/0290923 A1  Nov. 27, 2008

(51) Int. Cl.
*H03H 11/26* (2006.01)
*G01S 7/40* (2006.01)
*G01S 13/00* (2006.01)

(52) U.S. Cl. .............. 342/174; 342/165; 342/175; 327/262; 327/276

(58) Field of Classification Search ............ 342/22, 342/165, 174, 175; 307/407, 409; 327/261, 327/262, 263, 269, 270, 271, 276; 713/400, 713/401; 702/85, 89, 79
See application file for complete search history.

(56) References Cited

U.S. PATENT DOCUMENTS

| | | | |
|---|---|---|---|
| 3,639,784 A * | 2/1972 | Kelleher, Jr. | 327/294 |
| 4,438,404 A | 3/1984 | Philipp | |
| 4,581,715 A | 4/1986 | Hyatt | |
| 4,590,614 A | 5/1986 | Erat | |
| 4,678,345 A | 7/1987 | Agoston | |
| 4,686,655 A | 8/1987 | Hyatt | |
| 4,715,000 A | 12/1987 | Premerlani | |
| 4,760,525 A | 7/1988 | Webb | |
| 5,003,562 A | 3/1991 | van Driest et al. | |
| 5,053,983 A | 10/1991 | Hyatt | |
| 5,115,245 A | 5/1992 | Wen et al. | |
| 5,192,886 A | 3/1993 | Wetlaufer | |
| 5,243,343 A | 9/1993 | Moriyasu | |
| 5,315,627 A | 5/1994 | Draving | |
| 5,386,215 A | 1/1995 | Brown | |
| 5,420,531 A * | 5/1995 | Wetlaufer | 327/270 |
| 5,420,589 A | 5/1995 | Wells et al. | |
| 5,424,735 A | 6/1995 | Arkas et al. | |
| 5,444,459 A | 8/1995 | Moriyasu | |
| 5,451,894 A * | 9/1995 | Guo | 327/241 |
| 5,495,260 A | 2/1996 | Couture | |

(Continued)

FOREIGN PATENT DOCUMENTS

CA  2266222  9/1999

OTHER PUBLICATIONS

Office Action issued in U.S. Appl. No. 11/292,433 mailed Nov. 24, 2008.

(Continued)

*Primary Examiner*—Thomas H Tarcza
*Assistant Examiner*—Peter M Bythrow
(74) *Attorney, Agent, or Firm*—DLA Piper LLP (US)

(57) ABSTRACT

A variable delay apparatus comprises a calibrating unit receiving a signal from a variable delay unit and from a plurality of fixed delay sources, the calibrating unit comparing the signal from the variable delay unit with a plurality of signals from the fixed delay sources to control operation of the variable delay unit over a delay range independently of environmentally-induced drift.

30 Claims, 4 Drawing Sheets

U.S. PATENT DOCUMENTS

| | | | |
|---|---|---|---|
| 5,510,800 A | 4/1996 | McEwan | |
| 5,523,760 A | 6/1996 | McEwan | |
| 5,552,793 A | 9/1996 | McLeod et al. | |
| 5,661,490 A * | 8/1997 | McEwan | 342/387 |
| 5,748,153 A | 5/1998 | McKinzie, III et al. | |
| 5,805,110 A | 9/1998 | McEwan | |
| 5,900,761 A * | 5/1999 | Hideno et al. | 327/261 |
| 5,900,833 A * | 5/1999 | Sunlin et al. | 342/22 |
| 5,939,912 A | 8/1999 | Rehm | |
| 5,969,667 A | 10/1999 | Farmer et al. | |
| 5,986,600 A * | 11/1999 | McEwan | 342/28 |
| 6,002,723 A | 12/1999 | Chethik | |
| 6,055,287 A * | 4/2000 | McEwan | 375/376 |
| 6,137,433 A | 10/2000 | Zavorotny et al. | |
| 6,150,863 A * | 11/2000 | Conn et al. | 327/270 |
| 6,239,764 B1 | 5/2001 | Timofeev et al. | |
| 6,249,242 B1 | 6/2001 | Sekine et al. | |
| 6,281,833 B1 * | 8/2001 | Pringle et al. | 342/95 |
| 6,329,929 B1 | 12/2001 | Weijand et al. | |
| 6,342,866 B1 | 1/2002 | Ho et al. | |
| 6,345,099 B1 | 2/2002 | Alvarez | |
| 6,433,720 B1 | 8/2002 | Libove et al. | |
| 6,501,413 B2 * | 12/2002 | Annan et al. | 342/22 |
| 6,538,614 B2 | 3/2003 | Fleming et al. | |
| 6,580,304 B1 * | 6/2003 | Rieven | 327/276 |
| 6,650,661 B1 | 11/2003 | Buchanan et al. | |
| 6,657,577 B1 | 12/2003 | Gregersen et al. | |
| 6,680,634 B1 | 1/2004 | Ruha et al. | |
| 6,690,741 B1 | 2/2004 | Larrick, Jr. et al. | |
| 6,694,273 B2 | 2/2004 | Kurooka et al. | |
| 6,726,146 B2 | 4/2004 | Li et al. | |
| 6,778,000 B2 | 8/2004 | Lee et al. | |
| 6,798,258 B2 * | 9/2004 | Rieven | 327/152 |
| 6,845,458 B2 | 1/2005 | Lin | |
| 6,845,459 B2 | 1/2005 | Lin | |
| 6,853,227 B2 | 2/2005 | Laletin | |
| 6,853,338 B2 | 2/2005 | McConnell | |
| 6,864,833 B2 * | 3/2005 | Lyon | 342/124 |
| 6,868,504 B1 | 3/2005 | Lin | |
| 6,885,343 B2 | 4/2005 | Roper | |
| 6,912,666 B2 | 6/2005 | Lin | |
| 6,914,468 B2 | 7/2005 | Van Dijk et al. | |
| 6,930,528 B2 | 8/2005 | Ajit | |
| 6,956,422 B2 * | 10/2005 | Reilly et al. | 327/261 |
| 7,020,794 B2 * | 3/2006 | Lin | 713/401 |
| 7,026,850 B2 * | 4/2006 | Atyunin et al. | 327/158 |
| 7,026,979 B2 | 4/2006 | Khosla | |
| 7,037,266 B2 | 5/2006 | Ferek-Petric et al. | |
| 7,042,385 B1 | 5/2006 | Wichmann | |
| 7,053,814 B2 | 5/2006 | Yap | |
| 7,157,952 B2 * | 1/2007 | Avants et al. | 327/276 |
| 7,203,600 B2 | 4/2007 | Keers et al. | |
| 2002/0000946 A1 | 1/2002 | Portin | |
| 2003/0043078 A1 | 3/2003 | Deng et al. | |
| 2003/0179025 A1* | 9/2003 | Partsch et al. | 327/158 |
| 2004/0036655 A1 | 2/2004 | Sainati et al. | |
| 2004/0090373 A1 | 5/2004 | Faraone et al. | |
| 2004/0111650 A1* | 6/2004 | Chen | 713/400 |
| 2004/0178838 A1* | 9/2004 | Ngo et al. | 327/276 |
| 2005/0200549 A1 | 9/2005 | Thompson et al. | |
| 2005/0237260 A1 | 10/2005 | Bancroft | |
| 2005/0286320 A1* | 12/2005 | Iwasaki | 365/189.05 |
| 2006/0038598 A1 | 2/2006 | Reilly et al. | |
| 2006/0038599 A1* | 2/2006 | Avants et al. | 327/276 |
| 2006/0087471 A1 | 4/2006 | Hintz | |
| 2006/0119407 A1* | 6/2006 | Abrosimov | 327/261 |
| 2006/0132210 A1* | 6/2006 | Kong et al. | 327/261 |
| 2006/0203613 A1 | 9/2006 | Thomsen et al. | |
| 2006/0256025 A1 | 11/2006 | Askildsen | |
| 2007/0080864 A1 | 4/2007 | Channabasappa | |

OTHER PUBLICATIONS

Daniels, Jeffrey J. et al., "Ground Penetrating Radar for Imaging Archeological Objects," Proceedings of the New Millennium International Forum on Conservation of Cultural Property, Dec. 5-8, 2000, pp. 247-265, edited by Suckwon Choi and Mancheol Suh, Institute of Conservation Science for Cultural Heritage, Kongju National University, Kongju, Korea.

Kinlaw, Alton E., et al., "Use of Ground Penetrating Radar to Image Burrows of the Gopher Tortoise (*Gopherus polyphemus*)," Herpetological Review, 2007, pp. 50-56, vol. 38, No. 1, Society for the Study of Amphibians and Reptiles.

"Energy Focusing Ground Penetrating Radar (EFGPR) Overview," Jan. 28, 2003, pp. 1-12, Geo-Centers, Inc.

Kim et al., Design and Realization of a Discretely Loaded Resistive Vee Dipole on a Printed Circuit Board, 2003, pp. 818-829, vol. 5089, Proceedings of SPIE.

Montoya et al., Land Mine Detection Using a Ground-Penetrating Radar Based on Resistively Loaded Vee Dipoles, Dec. 1999, pp. 1795-1806, vol. 47, No. 12, IEEE Transactions on Antennas and Propagation.

Whiteley, et al., 50 GHz Sampler Hybrid Utilizing a Small Shockline and an Internal SRD, 1991, pp. 895-898, IEEE Microwave Theory & Technique-S Digest.

Tek Sampling Oscilloscopes Technique Primer 47W-7209, October 2989, pp. 1-4, Tektronix, Inc.

Office Action issued in related U.S. Appl. No. 11/260,038 mailed Oct. 17, 2007.

Office Action issued in related U.S. Appl. No. 11/260,038 mailed Mar. 17, 2007.

Office Action issued in related U.S. Appl. No. 11/260,038 mailed Aug. 6, 2008.

Office Action issued in related U.S. Appl. No. 11/754,136 mailed May 12, 2008.

Office Action issued in U.S. Appl. No. 11/754,152, mailed Oct. 21, 2008.

International Search Report issued in International Application No. PCT/US2008/72303, mailed Oct. 22, 2008.

Written Opinion issued in International Application No. PCT/US2008/72303, mailed Oct. 22, 2008.

Wikipedia, the free encyclopedia, "Field-Programmable Gate Array", Internet Brief, "http://en.wikipedia.org/wiki/FPGA", search date Sep. 27, 2006, 7 ppgs.

International Search Report issued in Application No. PCT/US2008/064541 mailed Nov. 4, 2008.

Written Opinion issued in Application No. PCT/US2008/064541 mialed Nov. 4, 2008.

International Search Report issued in Application No. PCT/US2008/072543 mailed Nov. 4, 2008.

Written Opinion issued in Application No. PCT/US2008/072543 mailed Nov. 4, 2008.

Office Action issued in U.S. Appl. No. 11/754,136 mailed Jan. 5, 2009.

Final Office Action issued in U.S. Appl. No. 11/260,038 dated Feb. 5, 2009.

Office Action issued in U.S. Appl. No. 09/273,461 mailed Jan. 21, 2000.

Office Action issued in U.S. Appl. No. 09/273,461 mailed Jul. 6, 2000.

U.S. Appl. No. 09/273,461.

Apr. 20, 2000 Response to Office Action issued Jan. 21, 2000.

Final Office Action issue in U.S. Appl. No. 11/754,152 mailed Apr. 24, 2009.

Final Office Action issue in U.S. Appl. No. 11/292,433 mailed May 12, 2009.

Notice of Allowance issued in U.S. Appl. No. 11/260,038 on May 29, 2009.

Response to Office Action issued in U.S. Appl. No. 11/292,433 filed Jun. 26, 2009.

International Search Report issued in PCT/US08/064552 on Jul. 7, 2009.

Written Opinion issued in PCT/US08/064552 on Jul. 7, 2009.

Press et al,. "Numerical Recipes in C: The Art of Scientific Computing—2nd", Cambridge University Press, Jan. 1, 1992.

Kim et al., "A Resistive Linear Antenna for Ground-Penetrating Radars", 2004, pp. 359-370, vol. 5415, proceedings of SPIE.

Kim et al., "Design of a Resistively Loaded Vee Dipole for Ultrawide-Band Ground-Penetrating Radar Applications", Aug. 2005, pp. 2525-2532, vol. 53, No. 8, IEE Transactions on Antennas and Propagation.

Kim et al., "Design and Realization of a Discretely Loaded Resistive Vee Dipole for Ground-Penetrating Radars", Jul. 2004, pp. 1-9, vol. 39, Radio Science.

Montoya, Thomas P., "Vee Dipole Antennas for use in Short-Pulse Ground-Penetrating Radars", Mar. 1998, Georgia Institute of Technology.

Notice of Allowance issued in U.S. Appl. No. 11/754,152 on Sep. 21, 2009.

Notice of Allowance issued in U.S. Appl. No. 11/260,038 on Sep. 25, 2009.

Request for Continued Examination (RCE) filed in related U.S. Appl. No. 11/292,433 on Nov. 10, 2009.

Supplemental Notice of Allowability issued in related U.S. Appl. No. 11/754,152 on Nov. 18, 2009.

* cited by examiner

SIMPLIFIED DELAY ADJUSTMENT RANGE

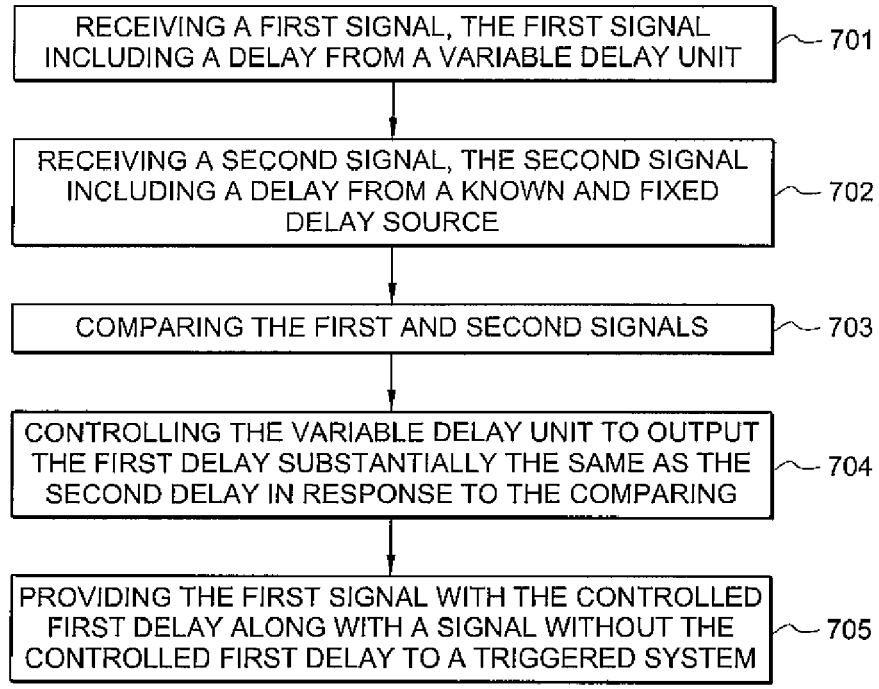
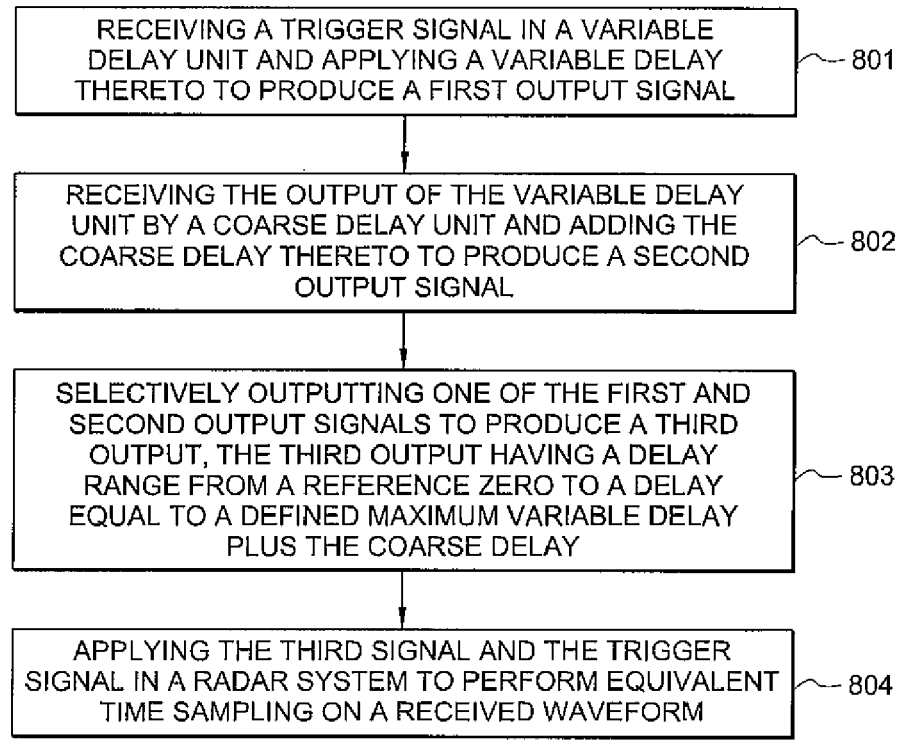

SYSTEMS AND METHODS FOR PROVIDING DELAYED SIGNALS

CROSS-REFERENCE TO RELATED APPLICATIONS

The present application is related to concurrently filed, co-pending, and commonly assigned U.S. patent application Ser. No. 11/754,136, entitled "SYSTEMS AND METHODS FOR PROVIDING TRIGGER TIMING"; and U.S. patent application Ser. No. 11/754,152, entitled "SYSTEMS AND METHODS USING MULTIPLE DOWN CONVERSION RATIOS IN ACQUISITION WINDOWS", the disclosures of which are hereby incorporated herein by reference.

TECHNICAL FIELD

The present description relates, in general, to signal delays and, more specifically, to systems and methods for providing delayed signals.

BACKGROUND OF THE INVENTION

Equivalent time sampling is a technique to sample substantially repeating signals. In one example, a high-frequency signal is sampled at a given point during a first cycle. During the next cycle, it is sampled at another point offset some amount from the first point, the offset represented in time by $\Delta t$. In successive cycles, $\Delta t$ is increased so that the sampling point moves, eventually covering the entire waveform. Thus, the waveform is sampled over a time window spanning multiple signals cycles, and the samples can be processed to create a reconstructed waveform with the same shape as the original waveform, though "stretched out" over time. Analysis can then be performed on the reconstructed waveform instead of using the original, high-frequency signal.

One technique to perform equivalent time sampling on a wave uses two trigger signals. The first trigger signal is fixed in frequency, and it triggers the transmission of the waveform. The second trigger signal is delayed from the first trigger, and it is used to cause a sampling of the waveform. The delay of the second trigger is has a $\Delta t$ that is increased with each cycle, as described above.

Prior art systems for creating the two trigger signals in radar systems are based on analog circuits. For example, one system has a dual-ramp mode which has a slow ramp and a fast ramp, where the slow ramp adds delay in a finer increments than does the fast ramp. The slow ramp determines where on the fast ramp the pulse is generated. The signal is then fed to an analog comparator to generate the pulse at the desired points.

Such prior art systems usually have several disadvantages. For instance, such systems tend to perform differently at different operating temperatures and ages. Moreover, delay units of the same model have intrinsic fabrication variations. Tuning such systems to compensate for the temperature drift, age variation, and fabrication variation involves adjusting one or more potentiometers, which is difficult to do with precision during operation of the device. There is currently no system available that provides delayed signals reliably and with effective and efficient tuning.

BRIEF SUMMARY OF THE INVENTION

The present invention is directed to systems and methods for calibrating delayed signals and further to systems and methods for providing digitally controlled triggers in radar systems.

In one example embodiment, a technique compares a delayed signal from a programmable delay line to a known, fixed delay. The known, fixed delay may be independent of various phenomena that cause operational variance in the programmable delay line so that it is a dependable calibration delay. The delayed signal is adjusted so that its delay eventually equals or closely approximates the known delay. Moreover, multiple delay points in the signal may be calibrated in this way with the use of multiple known delays.

In some embodiments, systems and methods use a digitally programmable delay line to achieve strobe modulation for equivalent time sampling for radar acquisition. Calibration techniques, such as the one described above, may be used to calibrate the delay from the digitally programmable delay line.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 7 is an illustration of an exemplary method for calibrating a signal, adapted according to one embodiment of the invention; and FIG. 8 is an illustration of an exemplary method for providing a delayed signal to a radar system, such as in the system of FIG. 6.

DETAILED DESCRIPTION OF THE INVENTION

Figure 1:
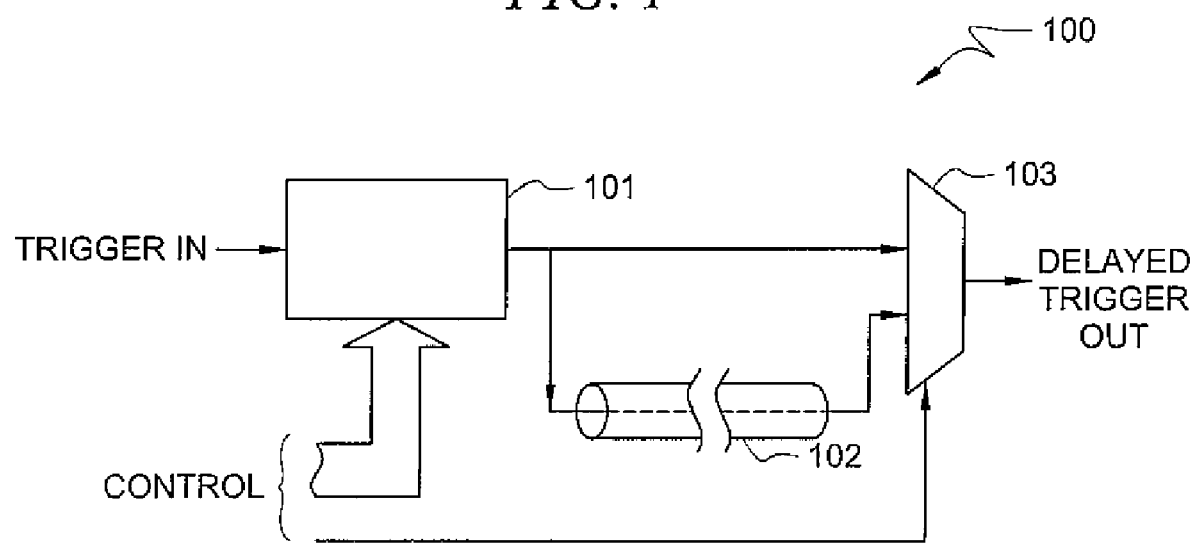
FIG. 1 is an illustration of an exemplary system adapted according to one embodiment of the invention.

FIG. 1 is an illustration of exemplary system 100 adapted according to one embodiment of the invention. System 100 includes variable delay unit 101. Variable delay unit can be any of a variety of delay units now known or later developed that apply a variable delay to a signal. Examples include a digitally controllable, programmable delay line model SY89296, available from Micrel, Inc. Variable delay unit 101 provides delay in a series of discrete steps, as explained in more detail below with regard to FIG. 2.

System 100 also includes second delay 102. Second delay 102 may be any of a variety of delay components now known or later developed, including but not limited to signal traces and coaxial cable. Coaxial cable is a desirable material in many embodiments due to its relatively precise and constant delay characteristics, even at a variety of operating temperatures. In system 100, the signal that is input to second delay 102 includes the delay provided by variable delay unit 101. In effect, variable delay unit 101 and second delay 102 are arranged in system 100 as fine step and coarse step delays, respectively.

System 100 also includes output unit 103 that selectively outputs one of its two input signals. Output unit 103 can include any kind of switch, such as a digital multiplexor. In one example, smaller delays are produced by outputting the signal from variable delay unit 101, whereas larger delays are produced by outputting the signal from second delay 102. The smallest delay can be produced by outputting the signal from variable delay 101 when it is at or near its defined minimum delay. Variable delay unit 101 can be controlled to produce an increasing delay with each cycle of the trigger signal. After variable delay unit 103 reaches its defined maximum, output unit 103 switches its output to the signal from second delay 102, and variable delay 101 decreases its delay at or near its minimum (e.g., a defined zero). Variable delay 101 then continues to increase its delay with each successive cycle.

While not shown, it should be noted that system 100 can be controlled by any of a variety of control units. For example, digital control can be provided by a general use processor (as in a personal computer), an Application Specific Integrated Circuit (ASIC), a specialized digital control chip, a Field Programmable Gate Array (FPGA), and/or the like.

Figure 2:
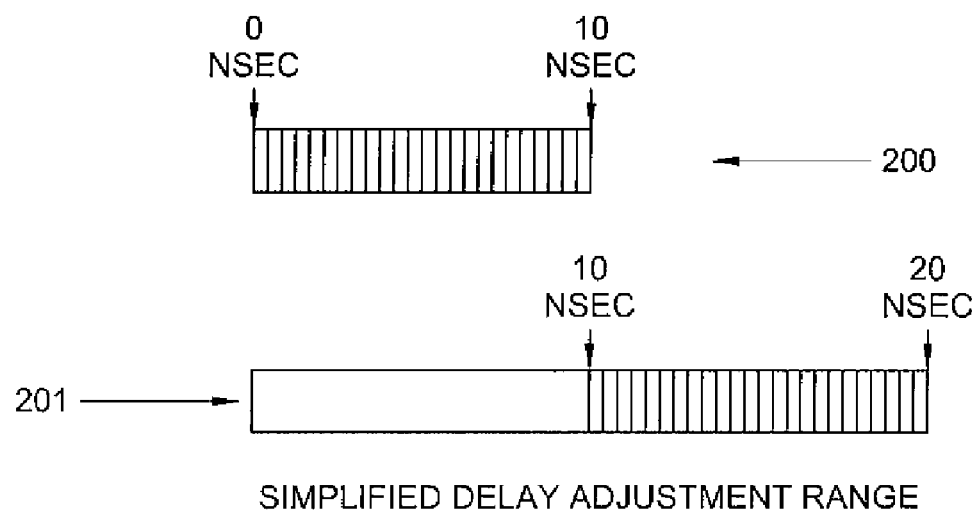
FIG. 2 is an exemplary delay diagram for the system of FIG. 1.

FIG. 2 is an exemplary delay diagram for system 100 (FIG. 1). In one example, fixed delay 102 provides 10 nsec of delay, and variable delay 101 provides up to 10 nsec of delay in linearly-increasing discrete steps. This allows for a total adjustment range of 20 nsec, as shown. Range 200 shows discrete steps attributable to variable delay 101, when output unit 103 outputs the signal from variable delay 101. Range 201 shows the delay that is possible when output unit 103 outputs the signal from fixed delay 102, wherein the first 10 nsecs are attributable to fixed delay 102, and the additional delay steps are provided by variable delay 102 with each successive cycle. Using this scenario, the delay "ramp" increases monotonically over the entire 20 nsec range.

Figure 3:
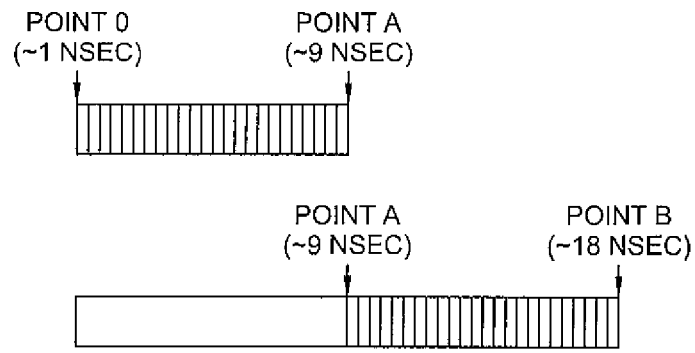
FIG. 3 is an exemplary delay diagram for the system of FIG. 1, showing example calibration points.

FIG. 3 is an exemplary delay diagram for system 100 (FIG. 1), showing example calibration points. A characteristic of some variable delay units (such as unit 101 of FIG. 1) is that performance is often dependent on temperature, age, and/or fabrication variation. For example, the silicon-based Micrel SY89296 experiences drift as the operating temperatures increase. Therefore, the delay provided at one point may be a few nanoseconds off from the corresponding delay step in the same system 5 minutes later. By contrast, wire-based fixed delays are relatively constant over most normal operating temperatures and ages as long as length is constant, though not all fixed delays are necessarily constant. Accordingly, many embodiments may benefit from one or more calibration techniques to compensate for drift and/or variation of delay components.

One example technique to compensate for drift and/or variation calibrates the delay to three known fixed delays (at points 0, A, & B in FIG. 3) provided by three known and real delays, for example, from three separate calibration coaxial cables. The calibration points in FIG. 3 generally correspond to near the beginning of the delay range (Point 0), near the middle of the delay range (Point A), and near the end of the delay range (Point B). In an embodiment wherein the calibration delay is provided by coaxial cables, the respective length of each of the cables corresponds to one of the delay points.

For instance, a first coaxial cable corresponding to Point 0 is cut so that a variable delay (e.g., 101 of FIG. 1) can be calibrated to match the delay at Point 0 when it is near the beginning of its delay range when a fixed delay (e.g., 102 of FIG. 1) is not switched in. This delay is chosen to be the defined zero point (e.g., the beginning of a radar observation window) in order to provide room for later adjustment, if needed. (The same can be said for Point B, which is near but not at the high end of the range.)

Continuing with this example, a second compensation coaxial cable corresponding to Point A is cut so that the variable delay can be calibrated to match the delay when adjusted to near the end of its delay range when the fixed delay line is not switched in.

As described above with regard to FIG. 2, various embodiments switch the output when the variable delay source reaches or nears its defined maximum, for example, by switching to an output that comes from a fixed delay source. In order to improve continuity at this switching point, some embodiments calibrate for Point A both with and without the fixed delay source switched in.

A third calibration coaxial cable corresponding to point B is cut so that the variable delay can be calibrated to match the output when adjusted to near the its defined maximum when the fixed delay line is switched in. This point can be defined as the end of an observation window.

Figure 4:
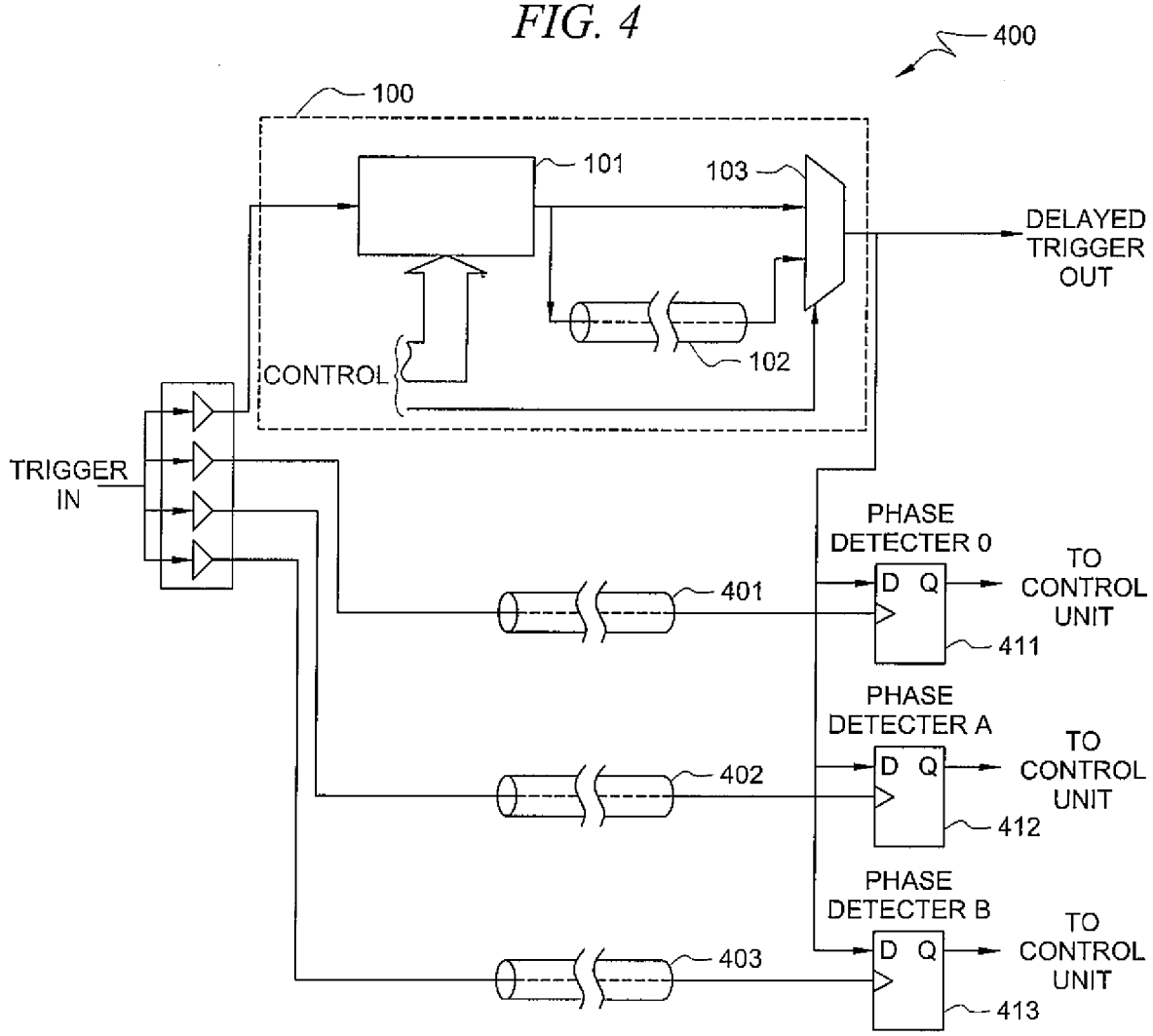
FIG. 4 is an illustration of an exemplary system adapted according to one embodiment of the invention for providing a delayed signal and calibrating the delay mechanism.

FIG. 4 is an illustration of exemplary system 400 adapted according to one embodiment of the invention for providing a delayed signal and calibrating the delay mechanism. System 400 includes system 100 with associated components for calibrating the delay provided to the signal. Calibration delay 401 corresponds to Point 0 of FIG. 3, calibration delay 402 corresponds to Point A, and calibration delay 403 corresponds to Point B. Each calibration delay 401-403, feeds into an associated phase detector 411-413. Output from phase detectors 411-413 goes to a control unit. In this example, phase detectors 411-413 are rising-edge flip-flops, though other embodiments may use different techniques, such as employing falling-edge flip-flops. The control unit (not shown) in this embodiment is the same control unit that controls system 101.

In system 400, calibration is performed as follows. First, output unit 103 selects the signal from variable delay 101, which is at or near its minimum. With each successive cycle, the delay is stepped up until phase detector 411 returns a zero. The zero indicates that the delay in the output signal and the delay from component 401 are the same. Similarly, a zero at phase detector 412 indicates that the delay in the signal is the same as that from component 402, and a zero at phase detector 413 indicates that the delay in the signal is the same as that from component 403. After the calibration tests are performed, the control unit knows which control word inputs are associated with Points 0, A, and B and controls system 100 accordingly.

Figure 5:
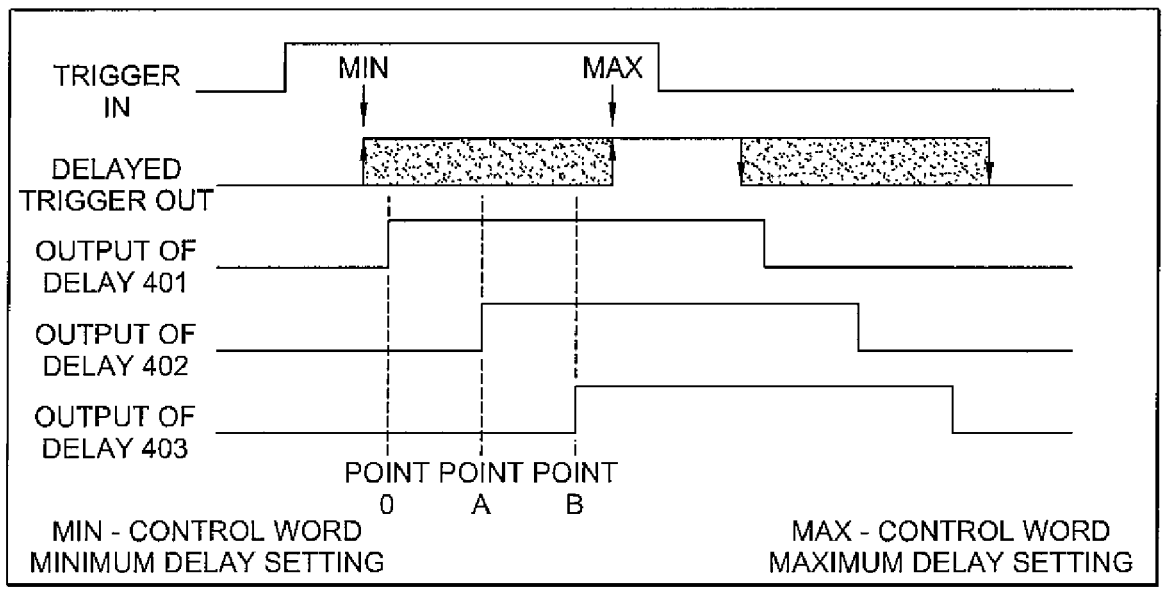
FIG. 5 is a signal timing diagram for the operation of the system of FIG. 4.

FIG. 5 is a signal timing diagram for the operation of system 400. FIG. 5 shows one repetition of the trigger signal. The outputs of phase comparators 411-413 are read by the control unit after Point B plus a small amount of propagation delay (for a more accurate reading) and before the next repetition. In some embodiments, this period represents the valid phase detector window.

In order to find the proper calibration settings of the trigger delay mechanism, the following procedure is used by system 400:

1. Set the control word to the minimum delay setting with fixed delay 102 (FIG. 4) switched out or not inserted. The output from phase detector 411 will be high during the valid phase detector window because the rising edge of the output of system 100 appears at an input to phase comparator 411 before the output from calibration unit 401 (clock input to the flip-flop).
2. Increment the control delay word once per signal cycle until the output read from phase detector 411 is low. At this control delay word value (called "delay zero"), the delay in system 100 matches the delay in calibration unit 401.
3. Repeat steps 1 and 2 for phase detector 412 also with fixed delay 102 switched out. The resulting control delay word can be called "delay A."
4. Repeat steps 1 and 2 for phase detector 412 with fixed delay 102 switched in. The resulting control delay word can be called "delay A prime."
5. Repeat steps 1 and 2 for phase detector 413 with fixed delay 102 switched in. The resulting control delay word can be called "delay B."

The control unit then uses these delay word values to increment the delay substantially linearly (i.e., at least 95% linear) and monotonically from the beginning to the end of the end of the observation window. The control delay word is incremented linearly from delay 0 to delay A without fixed delay 102 (delay window 1) and then from delay A prime to delay B with fixed delay 102 (delay window 2). Since the effective delay of the values "delay A" and "delay A prime" are equal, the control unit can calibrate before and after switching in fixed delay 102 while eliminating much non-linearity and discontinuity.

Systems such as system 100 (FIG. 1) and system 200 (FIG. 2) can be used in a variety of applications. For instance, the ramping delay provided by various embodiments can be adapted for use in systems that perform equivalent time sampling. Thus, in one embodiment, a radar system can use the trigger signal (input to system 100) as a transmit trigger and use the delayed trigger (output from system 100) as a receive trigger. The linearly increasing delay in the receive trigger can be used to capture successive portions of the returned signal waveform. The observation window discussed above can be used as the radar observation window.

Figure 6:
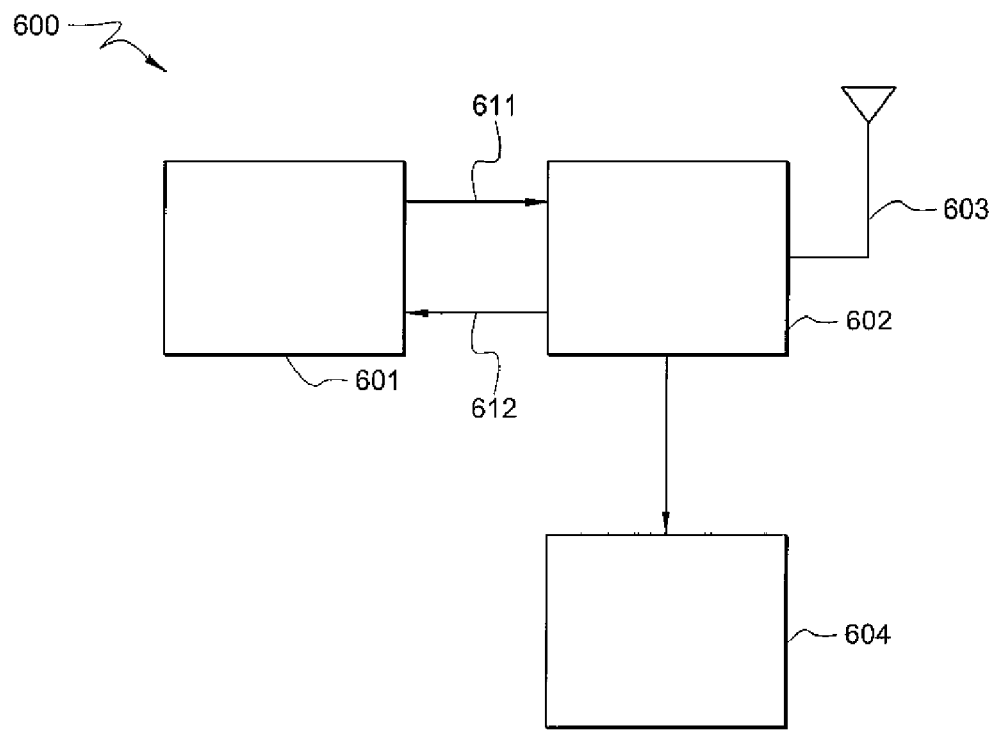
FIG. 6 is an illustration of an exemplary system adapted according to one embodiment of the invention.

A radar system adapted according to one embodiment of the invention is shown in FIG. 6, which is a simple schematic. System 600 includes trigger mechanism 601, Radio Frequency (RF) module 602, antenna 603, and signal processing unit 604. Trigger mechanism 601 in this example provides triggers 611 and 612, with trigger 612 being a delayed version of trigger 611. Trigger mechanism 601 can be implemented in a variety of ways, including as system 100 (FIG. 1) or as system 400 (FIG. 4) with associated control mechanisms. RF module 602 receives triggers 611 and 612 and performs the transmitting and receiving operations via antenna 603. While one antenna is shown, it should be noted that any number of antennas may be used and that separate antenna arrangements for transmitting and receiving may be employed by some embodiments. Returned signals are analyzed by processing unit 604 to provide output to a user or to another application. For example, processing unit 604 may analyze the signal using equivalent time sampling facilitated by the delayed trigger arrangement. A reconstructed waveform can then be used to provide data to a user or application.

In addition to finding utility in radar applications, various embodiments of the invention can be used in numerous applications. Any application that uses delayed signals to capture waveforms can potentially benefit, including signal analyzers in physics laboratories, microchip testers, and the like.

FIG. 7 is an illustration of exemplary method 700 for calibrating a signal, adapted according to one embodiment of the invention. Method 700 may be performed, for example, by a calibration system, such as system 400 (FIG. 4) with an associated control unit. In one example, the control unit executes machine readable code in the form of software and/or firmware to perform the operations.

In step 701, a first signal is received, the first signal including a delay from a variable delay unit. In one example, the variable delay unit is a semiconductor-based delay line that experiences drift with operating temperature. However, method 700 can be adapted for use with any kind of variable delay unit, regardless of the type of drift that it experiences.

In step 702, a second signal is received, the second signal including a delay from a known and fixed delay source. For example, the delay produced by cut coaxial cables can serve as a known and fixed delay. Further, the second delay is real, as it is actually applied to the second signal. In this example, the second delay is independent of the factors causing drift in the variable delay unit. For example, if the variable delay unit is a semiconductor device that drifts with temperature, the second delay may be provided by a component that is substantially temperature-independent, such as a wire-based component.

In step 703, the first and second signals are compared. The comparing can be performed, for example, by any of phase comparators 411-413 (FIG. 4). Further, the comparing may be performed over multiple cycles of the first signal with increasing or decreasing delay from the variable delay unit. Such comparing is described above with regard to FIG. 4. Step 703 may also include saving a parameter (such as an associated data control word) indicating when the delays of the first and second signals match.

In step 704, the variable delay unit is controlled to output the first delay substantially the same as the second delay in response to the comparing. For example, the first delay is calibrated so that it matches the known delay, at least at one delay point.

In step 705, the first signal with the controlled first delay is provided to a triggered system along with another signal without the first delay. For example, the two signals can be provided to a radar system with the delayed signal used as a receive trigger and the other signal used as a transmit trigger to perform equivalent time sampling. (Although it should be noted that it is possible to use a delayed trigger as a transmit signal and another non-delayed signal as a receive signal.)

Method 700 is shown as a series of discrete steps; however, various embodiments may add, omit, rearrange, or modify some steps. For example, steps 701-704 can be repeated for a plurality of calibration delays. For example FIG. 4 illustrates an embodiment with three calibration delays, and various embodiments are scalable for any number of calibration delays. Moreover, calibration can be performed at any of a variety of times during the operation of the system. It can be performed after a specified number of signal cycles, after a specified amount of time has passed, after an operating temperature change, and/or the like. Further, various embodiments are scalable for any number of delayed triggers, and each trigger can be calibrated for a number of delay points.

FIG. 8 is an illustration of exemplary method 800 for providing a delayed signal to a radar system, such as in system 600 (FIG. 6). Method 800 may be performed, for example, in a radar system, such as system 600. In one example, a control unit in radar system 600 executes machine readable code in the form of software and/or firmware to perform the operations.

In step 801, a trigger signal is received in a variable delay unit that applies a variable delay thereto to produce a first output signal. For example, the delay can be increased or decreased with successive cycles of the trigger signal so that the variable delay unit adds a changing delay to the trigger signal. An example of a variable delay is delay 101 of FIG. 1.

In step 802, the output of the variable delay unit is received by a coarse delay unit that adds a coarse delay thereto to produce a second output signal. Thus, the second output signal adds another delay to the first output signal. In some embodiments, the coarse delay may be a fixed delay, such as a coaxial cable, though other embodiments are not necessarily limited thereto.

In step 803, one of the first and second output signals are selectively output to produce a third output, the third output having a delay range from a reference zero to a delay equal to a defined maximum variable delay plus the fixed delay. A diagram of an example delay is shown in FIG. 2, with the variable delay acting as a fine delay in addition to the coarse delay. The selective outputting can be performed, for example, by a multiplexor, as shown in FIG. 1. In some embodiments, control input is used to select the output of the switching device so that the output is substantially linear over the entire delay range.

In step 804, the third signal and the trigger signal are applied in a radar system to perform equivalent time sampling on a received waveform. For example, the trigger signal can be used as a transmit trigger, and the third signal can be used as a ramping-delay receive trigger to successively sample different parts of a waveform with each cycle of the trigger.

Method 800 is shown as a series of discrete steps; however, various embodiments may add, omit, rearrange, or modify some steps. For example, steps 801-803 can be repeated over many cycles to produce two repeating triggers of a given frequency, with one trigger being increasingly delayed. Further, various embodiments are scalable for any number of delayed triggers.

Embodiments of the present invention may provide one or more advantages over prior art systems. For example, it is generally easier to control systems 100 (FIG. 1) and 400 (FIG. 4) than to control prior art analog signal-summing circuits that relied upon potentiometers for tuning. Thus, some embodiments may be more efficient to operate when compared to prior art systems.

Further, various embodiments of the invention are relatively independent of prior cycles. In prior art systems, such as systems that use analog signal summing circuits, the exact timing and the exact delay of the delay network is somewhat dependent on the length of time since the prior transmit to receive trigger pulse, mostly due to residual energy in associated capacitors and inductors. By contrast, many embodiments of the present invention eliminate much of the capacitance and inductance that causes prior event dependency in prior art systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A variable delay apparatus comprising:
   a calibrating unit receiving a signal from a variable delay unit and from at least one fixed delay source, said at least one fixed delay source being configured to fall within a delay range for calibration purposes, said calibrating unit comparing said signal from said variable delay unit with at least one signal from said at least one fixed delay source to control operation of said variable delay unit over said delay range independently of environmentally-induced drift.

2. The variable delay apparatus of claim 1 wherein said operation is within a temperature range causing temperature-dependent drift in said variable delay unit.

3. The variable delay apparatus of claim 1 wherein said delay range is substantially linear over time.

4. The variable delay apparatus of claim 1 wherein said calibrating unit calibrates said variable delay unit at a beginning and an end of said delay range.

5. The variable delay apparatus of claim 1 wherein said plurality of fixed delay sources comprise coaxial cables, each of a length to produce a respective, known delay.

6. The variable delay apparatus of claim 1 wherein said calibrating unit is in communication with a trigger output that outputs a first trigger signal with a variable delay over said delay range and a second trigger signal with a different delay characteristic.

7. The variable delay apparatus of claim 6 further comprising:
   a radar system in communication with said trigger output using said first and second trigger signals to perform equivalent time sampling on received radar information.

8. A system comprising:
   a programmable variable delay line providing a variable delay to a first trigger signal;
   a coarse delay unit in communication with said variably delayed trigger signal, said coarse delay unit providing a second delay to said variably delayed trigger signal;
   a calibration delay unit providing at least one known, fixed delay; and
   calibration logic comparing the delay from said calibration delay unit with said variably delayed trigger signal and with a signal from said coarse delay unit and providing input to control said programmable variable delay line in response to said comparing.

9. The system of claim 8 wherein said calibration logic controls said programmable variable delay line to delay said first trigger signal equal to said known, fixed delay.

10. The system of claim 8 further comprising:
    a switching component selectively outputting a signal selected from the list consisting of:
    said variably delayed trigger signal; and a signal from said coarse delay unit.

11. The system of claim 10, wherein said calibration delay unit includes a plurality of fixed delays and wherein said calibration logic compares the output of said switching component to said plurality of fixed delays, each at a different point in a delay range of said delayed trigger signal.

12. The system of claim 8 further comprising a switching unit selectively providing an output trigger signal to a radar unit, said signal selected from the list consisting of:
said variably delayed trigger signal; and a signal from said coarse delay unit.

13. The system of claim 12 wherein said switching unit provides said output trigger signal as a linearly increasingly delayed signal over a delay range, said increasing delay provided at least in part by said programmable variable delay line.

14. The system of claim 13 said radar unit receiving said output trigger signal and said first trigger signal and employing said output trigger signal and said first trigger signal to perform equivalent time sampling of received radio frequency information.

15. A system comprising:
a programmable variable delay unit adding a first delay to a trigger signal, said first delay variable over a delay range; and
a calibration unit including a first known, fixed delay corresponding to a first point in said delay range and a second known, fixed delay corresponding to a second point in said delay range, said calibration unit comparing said first delay with said first and second known, fixed delays, said calibration unit further providing control input to control said programmable variable delay unit to maintain said delay range constant over an operating temperature range causing drift in said programmable variable delay unit.

16. The system of claim 15 further comprising:
a second delay unit adding a second delay to said variably delayed trigger signal; and
a switching unit selectively outputting an output trigger selected from the list consisting of:
said variably delayed signal; and
said signal from said second delay unit.

17. The system of claim 16 wherein said second delay unit is a fixed delay unit.

18. The system of claim 16 further comprising:
a radar component using said output trigger to perform equivalent time sampling on received radar information.

19. A method comprising:
receiving a first signal, said first signal including a first delay from a variable delay unit;
receiving a second signal, said second signal including a second delay from a known and fixed delay source, the second delay representing a point in a delay range of the variable delay unit for calibration purposes;
comparing said first and second signals; and
controlling said variable delay unit to output said first delay substantially the same as said second delay in response to said comparing.

20. The method of claim 19 further comprising:
receiving a third signal, said third signal including a delay from another known and fixed delay source;
comparing said first and third signals; and
controlling said variable delay unit to output said first delay substantially the same as said third delay in response to said comparing, said second and third delays representing points in a delay range of said variable delay unit.

21. The method of claim 19 further comprising:
receiving a third signal, said third signal including a delay from another known and fixed delay source;
comparing said first and third signals; and
controlling said variable delay unit to output said first delay substantially the same as said third delay in response to said comparing, said second delay representing a point in a delay range of said variable delay unit, and said third delay representing the same point in said delay range of said variable delay unit wherein said a coarse delay source adds another delay to said first signal.

22. The method of claim 19 wherein said second and third delays are provided by respective wire delay components.

23. The method of claim 19 wherein operation of said variable delay unit drifts with temperature, and wherein said controlling maintains a delay of said first signal within a defined delay range over a temperature range causing drift in said variable delay unit.

24. A system comprising:
a digitally variable delay unit receiving a trigger signal and providing a first delay thereto to produce a first output signal;
a coarse delay unit receiving said first output signal and providing a coarse delay thereto to produce a second output signal;
a switching unit receiving said first and second output signals and outputting a selected one of said first and second output signals;
a calibration unit comparing at least one of said first and second output signals against at least one known fixed delay signal and maintaining delays of said first and second output signals within a defined range; and
a radar system using said first and second output signals and said trigger signal to perform equivalent time sampling on received data.

25. The system of claim 24 wherein said first delay is variable over a plurality of discrete delay steps, and the output of said switching unit has a substantially linearly increasing delay with each cycle of said trigger signal.

26. A method comprising:
receiving a trigger signal in a variable delay unit and applying a variable delay thereto to produce a first output signal;
receiving the output of said variable delay unit by a coarse delay unit and adding a second delay thereto to produce a second output signal;
calibrating the variable delay unit based on a comparison between at least one of said first and second output signals and at least one known fixed delayed signal;
selectively outputting one of said first and second output signals to produce a third output, said third output having a delay range from a reference zero to a delay equal to a defined maximum variable delay plus said second delay; and
applying said third signal and said trigger signal in a radar system to perform equivalent time sampling on a received waveform.

27. The method of claim 26 wherein said variable delay unit is a digital programmable delay unit operable to apply discrete delays between said defined zero and said defined maximum, said applying a variable delay comprises:
applying increasing discrete delay steps to said trigger signal during successive periods.

28. The method of claim 27 wherein said discrete delay steps are increased linearly.

29. The method of claim 27, wherein said selectively outputting comprises:

in one period, selectively outputting said first output signal with a delay equal to said defined maximum; and in a next period, selectively outputting said second output signal with said variable delay less than said defined maximum.

30. The variable delay apparatus of claim 3, wherein said linearity in said delay range is provided to compensate for non-linearity within said variable delay unit.

* * * * *